United States Patent
McNamara et al.

(10) Patent No.: US 8,170,828 B2
(45) Date of Patent: May 1, 2012

(54) TEST METHOD USING MEMORY PROGRAMMED WITH TESTS AND PROTOCOL TO COMMUNICATE BETWEEN DEVICE UNDER TEST AND TESTER

(75) Inventors: Patrick D. McNamara, San Francisco, CA (US); Douglas C. Lee, Cupertino, CA (US); Alan R. Gilchrist, Danville, CA (US); Sung-Wook Kang, Santa Clara, CA (US); Craig A. Pietrow, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 316 days.

(21) Appl. No.: 12/479,580

(22) Filed: Jun. 5, 2009

(65) Prior Publication Data

US 2010/0312517 A1    Dec. 9, 2010

(51) Int. Cl.
*G01R 31/317*  (2006.01)
*G01R 31/3181* (2006.01)
*G01R 31/3193* (2006.01)

(52) U.S. Cl. ........................ 702/119; 702/121
(58) Field of Classification Search .............. 702/119, 702/121, 118
See application file for complete search history.

(56) References Cited

U.S. PATENT DOCUMENTS

| | | | |
|---|---|---|---|
| 5,913,022 A * | 6/1999 | Tinaztepe et al. | 714/25 |
| 6,104,304 A | 8/2000 | Clark et al. | |
| 6,430,718 B1 | 8/2002 | Nayak | |
| 7,269,805 B1 * | 9/2007 | Ansari et al. | 716/136 |
| 7,496,820 B1 | 2/2009 | Theron et al. | |
| 8,005,638 B1 * | 8/2011 | Mehta et al. | 702/121 |
| 2005/0246589 A1 * | 11/2005 | Tsai et al. | 714/38 |
| 2009/0322346 A1 * | 12/2009 | Cao | 324/555 |

* cited by examiner

*Primary Examiner* — Drew A Dunn
*Assistant Examiner* — Regis Betsch
(74) *Attorney, Agent, or Firm* — Lawrence J. Merkel; Meyertons, Hood, Kivlin, Kowert & Goetzel, P.C.

(57) ABSTRACT

In an embodiment, a test method is implemented to test an integrated circuit that includes at least one processor. The method may include programming a memory to which the integrated circuit is coupled during testing with one or more test programs. The integrated circuit may be booted, and the processor may execute the test programs from the memory. In one embodiment, the memory may also store a control program that may manage the execution of the tests. In an embodiment, the control program may also implement a protocol to communicate with the ATE to perform the testing. The protocol may be implemented over a set of general purpose input/output (I/O) pins, for example. Using the protocol and test vectors on the ATE, the tests may be selected and executed, and test results may be reported.

13 Claims, 6 Drawing Sheets

TEST METHOD USING MEMORY PROGRAMMED WITH TESTS AND PROTOCOL TO COMMUNICATE BETWEEN DEVICE UNDER TEST AND TESTER

BACKGROUND

1. Field of the Invention

This invention is related to the field of integrated circuit testing.

2. Description of the Related Art

Integrated circuits generally must be tested to detect whether or not the circuits were fabricated correctly. The testing generally includes functional testing, which may be performed at low speeds and may detect circuitry that is not working at all (e.g. due to open connections or shorts in the interconnect, devices that were not fabricated properly, etc.). The testing also includes at-speed testing to determine if the circuitry will operating properly at various operating points (e.g. selected operating frequencies for the clocks provided to the integrated circuit and/or generated within the integrated circuit, selected operating voltages for those frequencies, etc.).

Traditionally, integrated circuit testing is performed using automated test equipment (ATE). An ATE can connect to the integrated circuit and test it using test vectors supplied by the integrated circuit designers, micro-architects, design verification engineers, design for test (DFT) engineers and silicon validation engineers. Each test vector can specify values to be driven by the ATE on inputs of the integrated circuit and values expected by the ATE on outputs of the integrated circuit for a given period of time. The period of time can be a clock cycle of a clock supplied to the integrated circuit, one half of the clock cycle, or any other period of time (e.g. a period specified in nanoseconds or picoseconds). The ATE can drive the inputs as specified in the test vector and sense the outputs for comparison to the test vector, or for comparison to an expected different output pattern. If the integrated circuit passes all the test vectors, the integrated circuit can be viewed as fabricated correctly and sellable. If the integrated circuit fails one or more test vectors, it can be binned, or removed from the sales channel and scrapped (or sold at a lower operating frequency, if it fails at-speed tests).

As integrated circuits grow in complexity, the testing of the integrated circuits can also become more complex. Increased complexity can be experienced, for example, if the integrated circuit includes one or more "clock domains" that can be operating at different frequencies concurrently. In such cases, some of the interfaces within the integrated circuit that cross clock domains are asynchronous. The timing of communications over the asynchronous interfaces can be unpredictable (within a window of a few clock cycles). Since traditional test vectors specify expected outputs over a certain period of time, the unpredictability of the timing (which is correct operation and should not be detected as a failure) is made more difficult. In some cases, the unpredictability can make traditional testing using test vectors practically impossible. The number of combinations of correct inputs and outputs can be very large. Additionally, the timing of some inputs can change based on the timing at which outputs are detected, which would require the ATE to change the inputs on the fly, during testing.

Complex integrated circuits such as systems on a chip (SOCs) can also complicate testing. SOCs include a variety of different functional blocks or components, such as processors, peripherals, on chip memory and caches, etc. Testing the blocks in a reasonable amount of test time can be challenging.

SUMMARY

In an embodiment, a test method is implemented to test an integrated circuit that includes at least one processor. The method may include programming a memory with one or more test programs. During testing, the integrated circuit is coupled to the memory. The integrated circuit may be booted, and the processor may execute the test programs from the memory. In one embodiment, the memory may also store a control program that may manage the execution of the tests. In an embodiment, the control program may also implement a protocol to communicate with the ATE to perform the testing. The protocol may be implemented over a set of general purpose input/output (I/O) pins of the integrated circuit, for example. Using the protocol and test vectors on the ATE, the tests may be selected and executed, and test results may be reported.

In an embodiment, the execution of tests as instructions executed by the processor in the integrated circuit and the determination of the test results on chip may simplify testing with asynchronous interfaces. For example, the timing of the transfers on the asynchronous interfaces may not be factored into the pass/fail result, in an embodiment. Other embodiments may be used with integrated circuits that do not include asynchronous interfaces, however. In another embodiment, the execution of the tests as instructions may use the internal clocking of the integrated circuit in a normal functional mode, rather than a test mode. Such embodiments may more accurately test the integrated circuit. In an embodiment, the protocol may permit desired levels of ATE control over the test (via test vectors programmed into the ATE) while managing the on chip testing via the control program. Various components or portions of the integrated circuit may be efficiently tested using the test programs.

BRIEF DESCRIPTION OF THE DRAWINGS

The following detailed description makes reference to the accompanying drawings, which are now briefly described.

Figure 1:
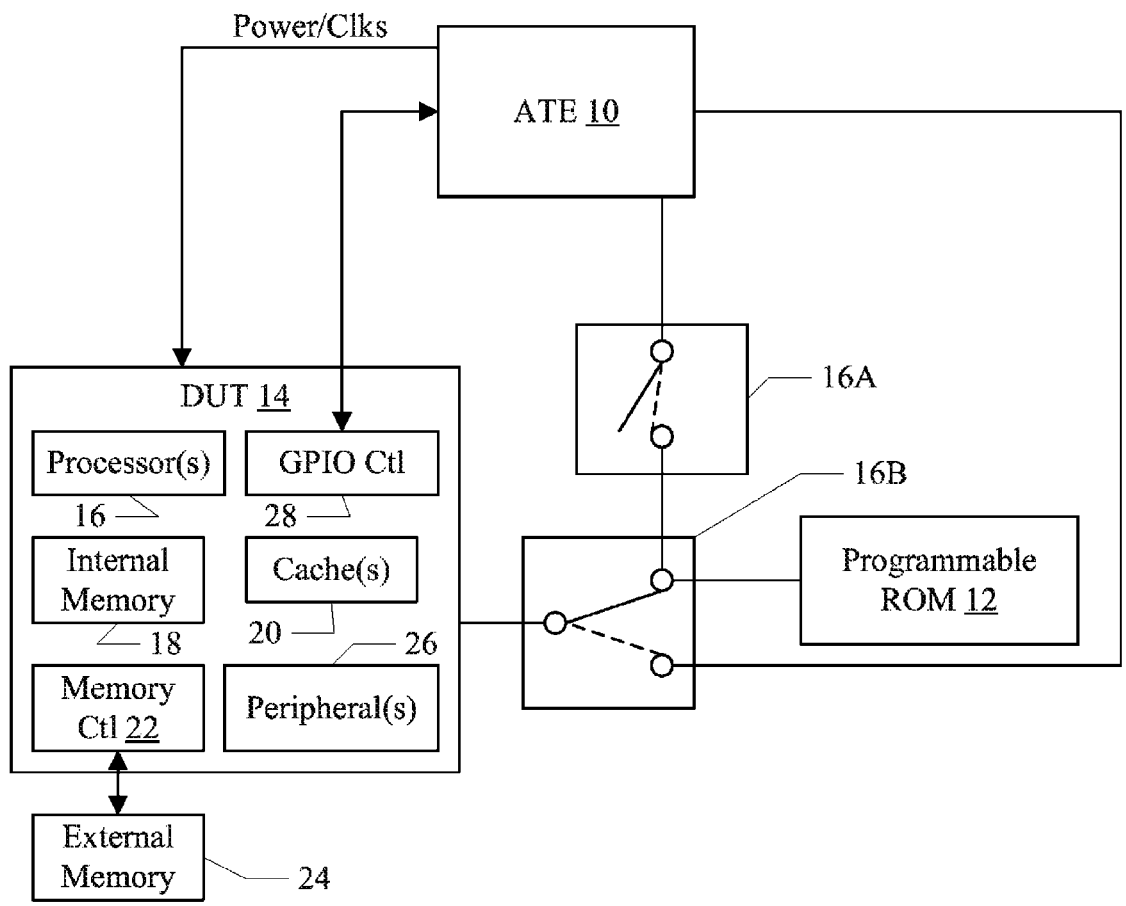
FIG. 1 is a block diagram of one embodiment of a test configuration including an automated test equipment (ATE), a programmable read-only memory (ROM), and a device under test (DUT).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of a test configuration is shown. In the illustrated embodiment, the configuration includes an ATE 10, a programmable read-only memory (ROM) 12, a device under test (DUT) 14, and relays 16A-16B. The ATE 10 is coupled to the relays 16A-16B. The programmable ROM 12 is coupled to the relay 16B, which is further coupled to the relay 16A and the DUT 14. The DUT 14 is coupled to the ATE 10.

In the configuration of FIG. 1, the ATE 10 may program the ROM 12 with tests to be executed on the DUT 14. More particularly, in the illustrated embodiment, the DUT 14 includes at least one processor 16 (and may include more than one processor in various embodiments). The processor 16 may implement an instruction set architecture defining a set of instructions that are executable by the processor. The tests programmed into the ROM 12 may be composed of instructions defined in the instruction set architecture. That is, the tests may be test programs. The instructions, when executed by the processor 16, exercise the functionality that the test program is intended to test. The test program may be intended to assess correct operation, exercise a critical timing path at speed, etc.

The functionality targeted by the test may include, for example, one or more of: the processor 16 itself, one or more caches 20, one or more internal memories 18, one or more memory controllers 22, external memory 24 controlled by the memory controller 22, one or more peripherals 26, and/or one or more general purpose input/output (GPIO) controllers 28. The DUT 14 may include any combination of the above components, or subsets of the above components, and any other desired components, in various embodiments.

Once the ROM 12 is programmed with the tests, the DUT 14 may be booted and may read the tests from the ROM 12. That is, the ROM 12 may be coupled to an interface of the DUT 14 from which the DUT 14 may be configured to read data during boot. For example, the interface may be the serial peripheral interface (SPI), any type of ROM memory interface such as a flash memory interface, or any other interface to which a ROM can be connected. In particular, the ROM may be coupled to an interface from which the DUT 14 is configured to fetch instructions to be executed during boot. In one embodiment, the DUT 14 may be configured to read instructions from the ROM 12 and store them in the internal memory 18 and/or the external memory 24. In other embodiments, the DUT 14 may fetch instructions from the ROM 12 directly for execution, and/or they may be cached in an internal cache such as cache(s) 20 in FIG. 1.

In one embodiment, the ROM 12 may also store a control program. The control program may be read from the ROM 12 first by the DUT 14 (e.g. the control program may be located at the address from which the DUT 14 will fetch instructions after booting). The control program may manage the execution of the test programs, and may report results in a fashion that is observable by the ATE 10. In one embodiment, the control program may implement a protocol in conjunction with test vectors on the ATE 10 to communicate during testing and to control the execution of tests. The protocol may be implemented, e.g., over the GPIO lines that are controlled by the GPIO control unit 28. Generally, GPIO lines (or more briefly, GPIOs) may be used to convey any desired input/output signals. That is, the DUT 14 does not define specific hardware protocol over the GPIOs. Instead, the GPIO control unit 28 may drive outputs programmed by software executing on the processors 16 or capture the input value for GPIOs programmed as inputs. Each GPIO may be programmable as an input or an output in the GPIO control unit 28 (and the input/output nature of the line may be changed by modifying the programming in the GPIO control unit 28). The value to be driven (for an output) or the value received (for an input) may be written to/read from the GPIO control unit 28 by software as well. The GPIO control unit 28 may drive outputs continuously, changing the output synchronously to a clock for the GPIO control unit 28 (not shown in FIG. 1) when the value written to the GPIO control unit 28 is changed by software executing on the processor 16. The value on inputs may be sampled synchronously to the clock as well.

The GPIOs may be used as inputs and outputs according to the defined protocol implemented by the control program and the test vectors on the ATE 10. During boot, the control program may program the GPIOs that are used to implement the protocol as inputs or outputs, respectively. The control program may write values to drive on the outputs, and read values from the inputs, according to the protocol. Test vectors may be used on the ATE 10 to test for values on the outputs, and drive values on the inputs.

Generally, a protocol may define the mechanisms for communicating on the interface, the logical timing of the signals with respect to other signals used to implement the mechanisms, etc. For example, one embodiment below may use signal pairs (one output by the control program, one output by the ATE 10 based on test vectors in the ATE 10) to signal transitions in the test mechanisms, to communicate results, etc. Additionally, a test ID multi-bit input to the DUT 14 may be defined in the protocol to identify a test to be executed.

Other embodiments may include additional signaling mechanisms, or different signaling mechanisms, as desired.

With the relays 16A-16B in the positions shown in FIG. 1, the test configuration is ready to test the DUT 14 using test programs stored in the programmable ROM 12. Thus, the relay 16B couples the ROM 12 to the DUT 14 and the relay 16A is open. For programming the ROM 12, the relay 16A may be closed and the relay 16B may be switched so that the DUT 14 is not coupled to the interface to the ROM 12 (shown as dotted lines in the relays 16A-16B in FIG. 1). Accordingly, the ROM 12 may be coupled to the ATE 10 through the relay 16B and the relay 16A. The connection of the DUT 14 to the ATE 10 through the relay 16B may not be required, in some embodiments, and the relay 16B may be open when the relay 16A is closed. In other embodiments, the connection of the DUT 14 to the ATE 10 through the relay 16B may be used for traditional test vector testing, if desired. The ATE 10 may control the relays 16A-16B, and may ensure that either the ATE 10 or the DUT 14 (but not both) is coupled to the ROM 12 at any point in time. In other embodiments, the ATE 10 and the DUT 14 may be coupled in parallel to the ROM 12, and the ATE 10 and DUT 14 may be controlled so that only one of them is driving the interface to the ROM 12, or any portion thereof, at a time. Alternatively, any other type of switch circuit may be used. In some embodiments, only a portion of the ROM interface may be controlled by the relays 16A-16B. For example, the address and data interfaces may be coupled to the ATE 10 and the DUT 14 in parallel, and enable and control signals may be controlled by the relays 16A-16B.

The test configuration illustrated in FIG. 1 may be used at various test points in the process of manufacturing the DUT 14. For example, the DUT 14 (except for the external memory 24) may be an integrated circuit. In such an embodiment, the test configuration may be used at wafer test, after the integrated circuit has been fabricated and before the wafer of integrated circuits is diced. At that point in testing, the relays 16A-16B and the ROM 12 may be implemented on a probe card used to connect the ATE to individual integrated circuits on the wafer. Another point at which the test configuration may be used is at package test (or "final test"), after the integrated circuit has been packaged. At that point in the testing, the relays 16A-16B and the ROM 12 may be implemented on a load board to which the packaged integrated circuit is attached for testing.

The ROM 12 may be any type of programmable ROM (e.g. an erasable programmable ROM (EPROM), an electrically erasable PROM (EEPROM), a flash memory, etc. In some embodiments, the programming of the ROM 12 may be performed before the ROM 12 is inserted into the configuration. In still other embodiments, volatile memory may be used such as RAM, e.g. if the power to the memory may remain on when moving from integrated circuit to integrated circuit for testing.

The ROM 12 may only need programming when the test programs or control program are revised, unless all of the desired test programs will not fit in the ROM 12. The ROM 12 may be programmed using test vectors on the ATE 10, and those test vectors need only be performed to program the ROM 12 once, after which the ROM 12 may be used repeatedly to test different instances of the DUT 14. The time spent programming of the ROM 12 may thus be amortized over the DUTs that are tested using the test programs in the ROM 12.

In addition to using the GPIOs to form an interface over which the protocol between the control program and the ATE 10 test vectors, the ATE 10 may also be coupled to the DUT 14 to supply power and clocks to the DUT during test. The clocks may be the functional clock inputs to the DUT 14 (that would be coupled to clock sources in a final end product, for example), and the functional clock trees within the DUT 14 may be used during testing using the test programs (as opposed to using test clocks) in this embodiment.

As mentioned above, in one embodiment, the DUT 14 may be an integrated circuit. More particularly, in an embodiment, the DUT 14 may be a system on a chip including processors and various peripherals 26. The peripherals 26 that are included may vary from embodiment to embodiment. In one implementation, the peripherals 26 may include one or more of: audio processing devices, video processing devices, peripheral interface controllers for industry standard or proprietary external interfaces, network processing devices, etc. The memory controller 22 may be configured to couple to any type of external memory 24. For example, the external memory may comprise dynamic RAM (DRAM), synchronous DRAM (SDRAM), double data rate SDRAM (DDR SDRAM, DDR2 SDRAM, DDR3 SDRAM, etc.). In one embodiment, the external memory 24 may be mobile DDR3 SDRAM (mDDR3 SDRAM). In one particular embodiment, the external memory may be one or more mDDR3 SDRAM chips mounted in a chip on chip fashion to the integrated circuit 14 or a package on package fashion. Thus, the external memory 24 may be present at the package test stage.

Figure 2:
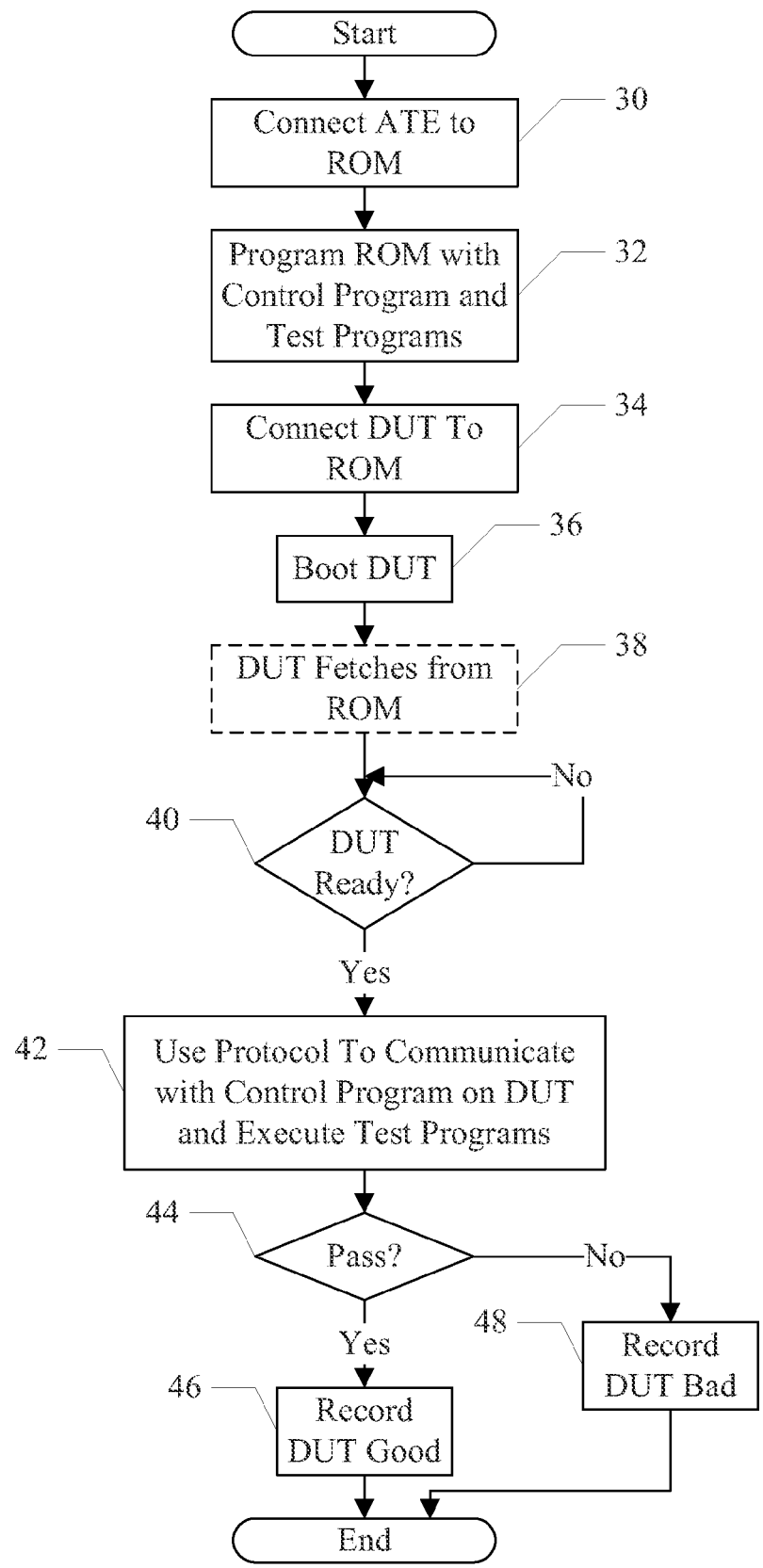
FIG. 2 is a flowchart illustrating one embodiment of testing the DUT in FIG. 1.

Turning next to FIG. 2, a flowchart is shown illustrating one embodiment of testing the DUT 14 in the test configuration illustrated in FIG. 1. While the blocks are shown in a particular order for ease of understanding, other orders may be used among independent blocks within the flowchart and/or independent blocks may be performed in parallel.

The ATE 10 may control the relays 16A-16B to connect the ATE to the ROM 12 (block 30). The ATE 10 may program the ROM with the control program and the test programs (block 32). Particularly, the ATE 10 may have been loaded with test vectors that control the interface to the ROM 12 to write the control program and test programs into the desired addresses of the ROM 12. That is, the test vectors may drive the inputs to the ROM 12 to cause writes to desired addresses, and may provide the instructions that form the control program and test programs as the data to be written. Once the ROM 12 has been programmed, the ATE 10 may control the relays 16A-16B to connect the ROM 12 to the DUT 14 (block 34). In some embodiments, only a portion of the ROM 12 interface may be switched between the ATE 10 and the DUT 14. For example, the address and data inputs to the ROM 12 may not be switched, but at least some of the control signals may be switched (e.g. ROM enable, read/write command control lines, etc.).

The DUT 14 may be booted (block 36). Generally, booting a DUT may include powering the DUT, resetting the DUT to an initial state, and allowing the DUT to initialize itself. The DUT 14 may include internal firmware, for example, that may perform low level initializations to permit the DUT 14 to begin fetching and executing instructions. Once the low level initializations are performed, the DUT 14 may fetch instructions from a predefined address. The predefined address may map to the ROM 12, or the DUT 14 may be configurable (e.g. via programming one or more pins during boot) to map the predefined address to the ROM 12 (or to some other source, e.g. via different programming on the one or more pins). In one embodiment, the ATE 10 may provide certain configuration information during boot (e.g. clock frequency selection and/or multipliers/divisors for phase lock loops in the DUT 14). In an embodiment, the configuration may be provided as part of the protocol, using GPIOs as inputs to provide the configuration. The configuration lines may be in addition to the exemplary protocol illustrated in FIG. 5 and described in more detail below.

Blocks 30, 32, 34, and 36 may be performed via test vectors on the ATE 10. Once the boot of the DUT 14 is started, the ATE 10 may wait for an indication defined in the protocol that the DUT 14 is booted and ready to begin tests. The indication may be provided by the control program that has been fetched from the ROM 12 and is in execution in the DUT 14 (dotted block 38).

Using the protocol, the DUT 14 may indicate ready (and the ATE 10 may perform test vectors to acknowledge the readiness—decision block 40). For example, the DUT 14 may be ready by asserting the Boot Done signal in the protocol, and the ATE 10 may acknowledge using the Ack signal in the protocol. Once the DUT 14 is ready (decision block 40, "yes" leg), testing of the DUT 14 may commence using the protocol to communicate between the control program on the DUT 14 and the test vectors on the ATE 10 (block 42). Once the tests are completed, the ATE 10 may evaluate the test results. If the DUT 14 passed the tests (decision block 44, "yes" leg), the ATE 10 may record the DUT 14 as good (block 46). If the DUT 14 failed one or more tests (decision block 24, "no" leg), the ATE 10 may record the DUT 14 as bad (and may also record which tests failed, any other information related to the failure, etc.) (block 45).

The flowchart of FIG. 2 illustrates the test of one DUT 14. The flowchart may be repeated for each DUT to be tested, except that the programming of the ROM need not be repeated if the test programs are not being changed. For example, subsequent DUTs may be tested beginning with the booting of the DUT (block 36). Thus, in an embodiment, the test vectors used to program the ROM 12 need not be repeated for each DUT, and the overhead of programming the ROM 12 may be amortized over the tested DUTs.

Figure 3:
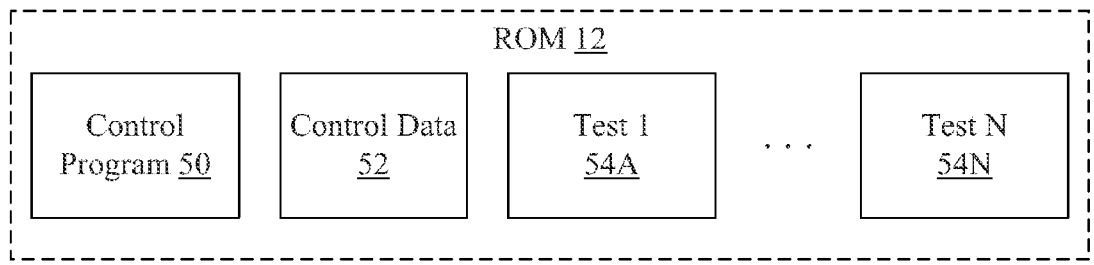
FIG. 3 is a block diagram of the ROM shown in FIG. 1, illustrating one embodiment of the contents of the ROM.

Turning next to FIG. 3, a block diagram of one embodiment of the ROM 12 is shown illustrating the ROM 12 storing the control program 50, a control data structure 52, and one or more test programs 54A-54N. Thus, the ROM 12 as shown in FIG. 3 is after being programmed by the ATE 10.

The control program 50 may be the control program mentioned above, which communicates using the protocol over the GPIOs with the ATE 10. In some embodiments, a control data structure 52 may be provided with the control program 50. For example, the control data structure 52 may include offsets to the beginning of the each test program 54A-54N within the ROM. Other data could be stored in the control data structure 52. For example, expected result values from each test program may be stored, if the control program checks results of the test programs. Alternatively, the test programs may generate signatures of the results, which may be compared to expected signatures. In yet another example, the control data structure 52 may indicate a location to store each test program for execution by the processor 16 (e.g. the internal memory 18 or the external memory 24, in the embodiment of FIG. 1). Any desired data may be stored in the control data structure 52. In other embodiments, the control data structure 52 may not be included.

The test programs 54A-54N may each comprise instructions which, when executed on the processor(s) 16, implement the desired tests. As mentioned above, the control program 50 may comprise instructions that, when executed on the processor(s) 16, manage the tests and communicate with the ATE 10 via the protocol 58 over the GPIOs. If there is more than one processor 16, the control program 50 may execute on one processor 16 and test programs 54A-54N may execute on another processor 16, unless processor functionality is the target of the test.

The ROM 12 is shown in FIG. 3 as storing the control program 50, the control data structure 52, and/or the test programs 54A-54N, and the ROM 12 may be one example of a computer accessible storage medium. In other embodiments, the control program 50, the control data structure 52, and/or the test programs 54A-54N may also be stored an any other computer accessible storage medium. For example, a computer accessible storage medium may be written with the control program 50, control data structure 52, and/or the test programs 54A-54N at a design house of the DUT 14 and may be delivered to the test facility at which the ATE 10 is located. The design house and the test facility may be different companies, in some embodiments, or may be part of the same company, in other embodiments. In some embodiments, the control program 50 may be provided by the test facility, and the test programs 54A-54N may be provided by the designer.

Generally, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link. Generally, the computer accessible storage medium may store any set of instructions which, when executed, implement a portion or all of the flowcharts shown in FIGS. 2 and 6-10. A carrier medium may include computer accessible storage media as well as transmission media such as wired or wireless transmission.

Figure 4:
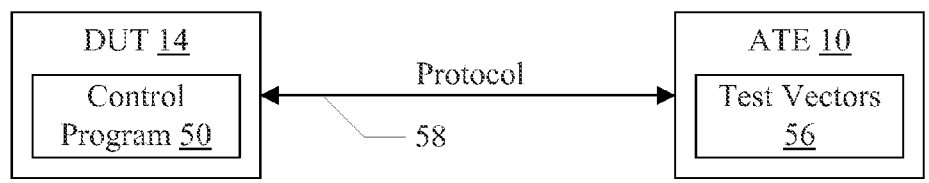
FIG. 4 is a block diagram of one embodiment of a protocol between the ATE and control program stored on the ROM and executed in the DUT.

FIG. 4 is a block diagram illustrating a logical view of the control program 50 executing on the DUT 14 and test vectors 56 performed on the ATE 10, and the protocol 58 between the DUT 14 and the ATE 10 for communication between the control program 50 and the ATE 10. As mentioned above, the protocol 58 may define the communication mechanisms between the control program 50 and the ATE 10 (test vectors 56). The protocol may be physically implemented over the GPIOs, in one embodiment.

Figure 5:
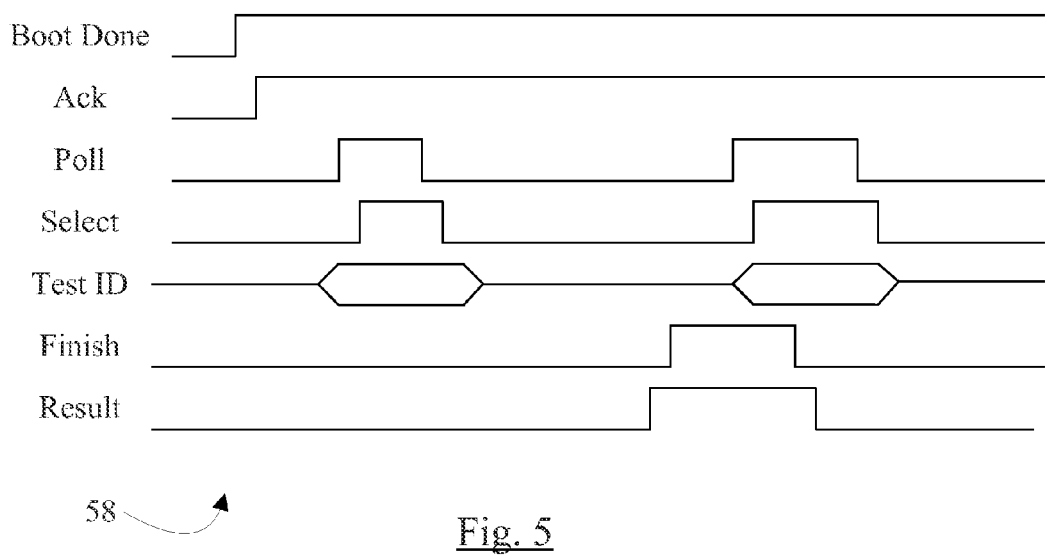
FIG. 5 is a timing diagram illustrating one embodiment of a protocol.

The protocol 58 may be as general and robust as desired, to permit as much or as little communication between the control program 50 and the ATE 10 as desired. FIG. 5 is a timing diagram illustrating an exemplary protocol 58 that may be used in operation for one embodiment. As mentioned previously, the protocol may also include configuration transmission that may be read during boot of the DUT 14.

The control program 50 may indicate completion of boot and readiness to perform the first test program by asserting the Boot Done signal shown in FIG. 5. The ATE 10 may recognize the boot completion by driving an acknowledgement signal (Ack) high. The control program 50 may indicate readiness to accept a test selection by driving the Poll signal high. In response, the ATE 10 may drive a test identifier (ID) on the Test ID lines to indicate the selected test. The Test ID may be any number of bits, with N bits supporting up to $2^N$ test programs in the ROM 12. For example, 8 bits may be used, supporting up to 256 test programs. The ATE 10 may drive the Select signal high to indicate that the Test ID is present. In one embodiment, the Test ID may be driven before the Select signal is asserted (high). The control program 50 may indicate that the Test ID has been accepted by driving the Poll signal low, and the ATE 10 may drive the select signal low in response.

The control program 50 may cause the selected test to execute and determine a result. The control program 50 may indicate that the selected test has finished by driving the Finish signal high, and may provide a result on the Result signal. In one embodiment, the Result signal may be driven prior to the Finish signal. The Result signal may indicate pass (high) or fail (low), although the opposite logic levels may be used for pass or fail. It is noted that, in some embodiments, the failure of the DUT/control program 50 to assert the Finish signal within a certain period of time may itself be an indication of test failure. Such a mechanism may be another way to detect a timeout of the test, for example.

The control program 50 may also drive the Poll signal high to indicate readiness to execute another test. The ATE 10 may drive a new Test ID and drive the Select signal high. The Select signal may serve as an indication that the Test ID is present and may also indicate that the Result of the previous test has been recorded. Accordingly, the control program 50 may deassert the Finish signal and the Result in response to the Select signal. The control program 50 may also capture the test ID, and deassert the Poll signal. In response, the ATE 10 may deassert the Select signal.

The protocol 58 as illustrated in FIG. 5 is merely exemplary, and other embodiments may include additional protocol or different protocol. For example, if a test fails, the protocol may include additional communication to permit additional failure information to be transmitted (e.g. a signature of the failure, an indication of which failure was detected if a test program tests more than one function, etc.). Alternatively, the Result signal may be a multibit value to provide such information.

When the protocol 58 is implemented on the GPIOs, driving a signal by the control program 50 may including writing the desired value for the signal to the GPIO control unit 28, identifying the GPIO pin that is mapped to the signal as the target of the write. Similarly, the control program 50 may capture a received value by reading the value from the GPIO control unit 28, identifying the GPIO pin that is mapped to the signal as the target of the read. The ATE 10 may similarly include test vectors that drive signals and wait for signals.

A pin may be any conductor that permits an integrated circuit to communicate with circuitry outside of the integrated circuit. For example, in a packaged integrated circuit, the pins may include the conductors on the outside of the package (metal legs or solder balls, for example) to which other devices may make electrical contact (e.g. through a circuit board to which the packaged integrated circuit is attached or to which a socket holding the integrated circuit is attached). The pins may also include the conductor within the package that makes contact with on-circuit conductors. For a bare integrated circuit on a wafer, the pin may include the conductors in the metal layers from a driver/receiver, as well as the connection points on the top of the integrated circuit (e.g. pads, controlled collapse chip connection (C4) bumps, etc.).

Figure 6:
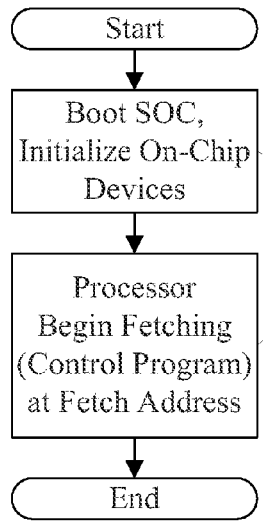
FIG. 6 is a flowchart illustrating operation of one embodiment of the DUT.

Turning now to FIG. 6, a flowchart is shown illustrating operation of one embodiment of the DUT 14 to boot the DUT (block 36 in FIG. 2). The embodiment of FIG. 6 may applicable to DUTs that are SOCs. Other DUTs (e.g. other integrated circuits) may boot in different fashions.

The SOC may boot, and on-chip devices such as the peripherals 26 and the memory controller 22 may be initialized (block 60). In one embodiment, the SOC may include firmware that may execute on the processor 16 to initialize some of the devices. In other embodiments, hardware circuitry may perform the initializations, or a combination of hardware and firmware executed by the processor 16 may perform the initialization. Upon completion of the initialization, the processor 16 may begin fetching at the address in the ROM 12 where the control program 50 is stored (block 62).

Figure 7:
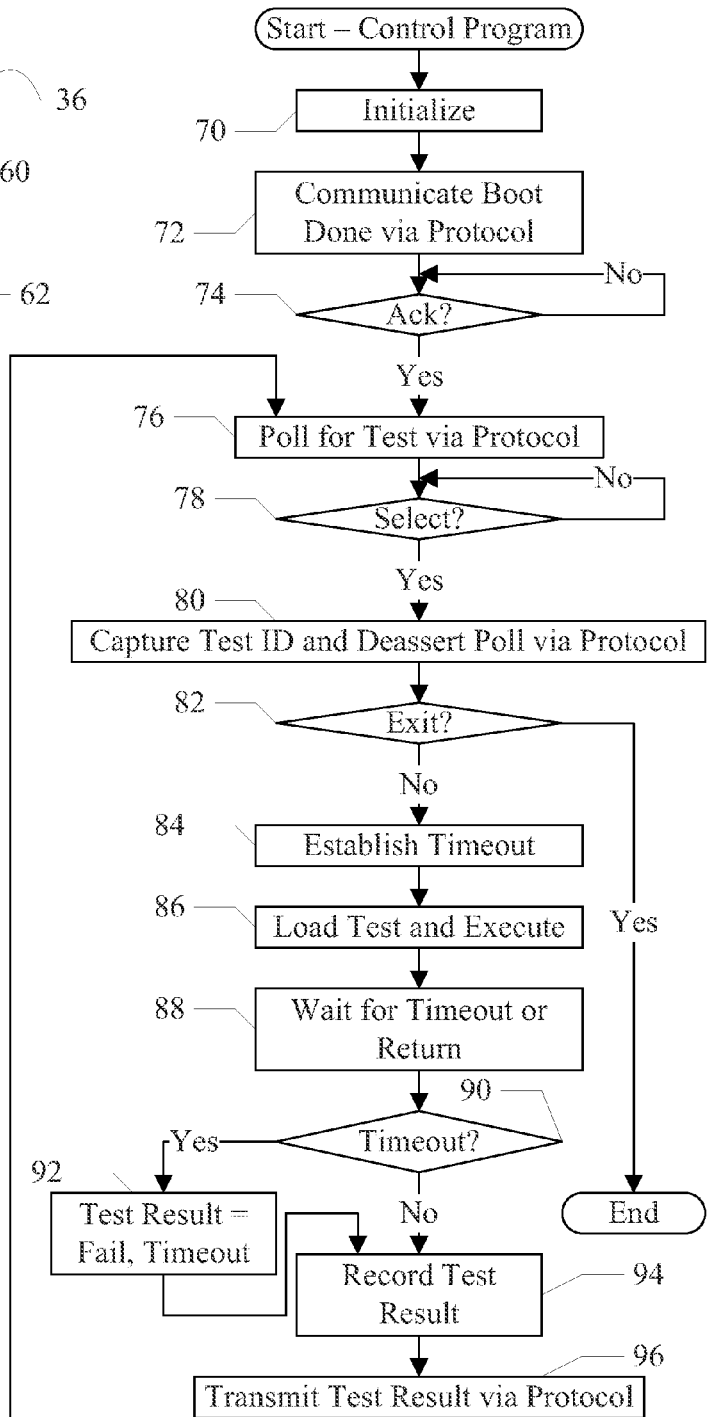
FIG. 7 is a flowchart illustrating operation of one embodiment of the control program executing on the DUT.

Turning now to FIG. 7, a flowchart is shown illustrating operation of one embodiment of the control program 50. The control program 50 may comprise instructions which, when executed by the processor on the DUT 14, implement the operation shown in FIG. 7. While the blocks are shown in a particular order for ease of understanding, other orders may be used.

The control program 50 may initialize any data structures or other data that the control program 50 may use (block 70). For example, in an embodiment, the control data structure 52 may be read and placed in memory such as the internal memory 18 and/or the cache(s) 20. Other data structures may be initialized as well (e.g. to record results, etc.). The control program 50 may communicate Boot Done to the ATE 10 via the protocol (e.g. writing a logical one to the register controlling the value on the GPIO assigned to the Boot Done signal—block 72). The control program 50 may then wait to receive the Ack from the ATE 10, sampling the GPIO assigned to the Ack signal. Once the Ack is received (decision block 74, "yes" leg), the control program 50 may transmit the Poll for the test using the protocol (block 76) and wait for the Select signal to be asserted (decision block 78). Upon detecting the Select assertion (decision block 78, "yes" leg), the control program 50 may capture the test ID from the Test ID defined in the protocol, and may deassert the Poll signal (block 80). If the Finish signal is asserted (e.g. for tests performed after the first test), the Finish signal may also be deasserted along with the Result signal.

In one embodiment, one of the test IDs may be assigned to indicate that testing is complete and the control program may exit (decision block 82, "yes" leg). For example, the test ID of zero or the maximum test ID may indicate exit. If the test ID does not indicate exit (decision block 82, "no" leg), the control program 50 may optionally establish a timeout for the test (block 84). For example, the DUT 14 may include one or more "watchdog" timers that can be programmed to a time interval and may interrupt the processor at the expiration of the interval. Timeouts may be used to interrupt a test if it has been executing for much longer than expected (which may indicate a failure that has caused execution to cease, for example). Other embodiments may not implement timeouts.

The control program 50 may load the identified test program and begin its execution (block 86). In one embodiment, the control program 50 may load the test program and branch to the beginning of the program (so that test program execution occurs on the same processor as the control program 50). Alternatively, in embodiments including more than one processor 16, the control program 50 may dispatch the test program to execute on another processor and may monitor for completion of the test. In either case, the control program 50 may effectively wait for the timeout or a return/completion from the test program (block 88). If timeouts are implemented and a test program exits due to timeout (decision block 90, "yes" leg), the control program 50 may record a failure for the test and indicate the reason for failure as a timeout (block 92). Otherwise, the test result may be as reported by the test program (decision block 90, "no" leg). In either case, the control program 50 may optionally record the test result (block 94) and may transmit the result via the protocol (block 96). For example, the control program 50 may drive the Result signal and then drive the Finish signal. The result transmitted via the protocol may not include all of the information recorded for the test (e.g. it may be a pass/fail indication, and the recorded result may include a reason for failure). Subsequently, the control program 50 may return to block 76 to Poll for another test ID.

Figure 8:
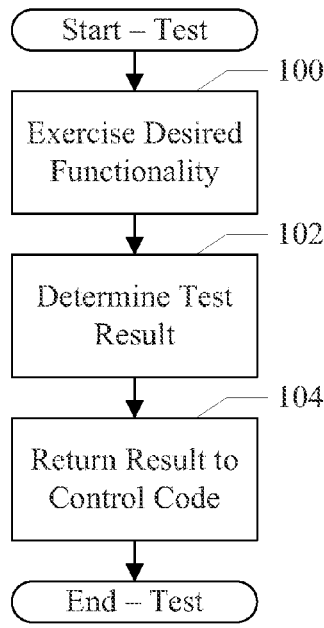
FIG. 8 is a flowchart illustrating operation of one embodiment of a test executing on the DUT.

Turning now to FIG. 8, a flowchart illustrating operation of one embodiment of a test program 54A-54N is shown. The test program 54A-54N may comprise instructions which, when executed by the processor on the DUT 14, implement the operation shown in FIG. 8. While the blocks are shown in a particular order for ease of understanding, other orders may be used.

The test program includes one or more instructions that exercise the desired functionality that is tested by the test (block 100). For example, a test for a peripheral may include reads and writes to the peripheral to cause the peripheral to perform the tested functions or to exercise certain timing paths in the peripheral. A test for an internal memory may read and write the memory. A test for the processor may execute instructions that test certain functionality or timing paths in the processor. The test program may include one or more instructions to determine the result of the test (block 102), and one or more instructions to return the result to the control program (block 104).

While the embodiment of FIGS. 7 and 8 illustrates the test program determining the pass/fail result and returning to the control program 50, other embodiments may perform result checking in the control program 50.

Figure 9:
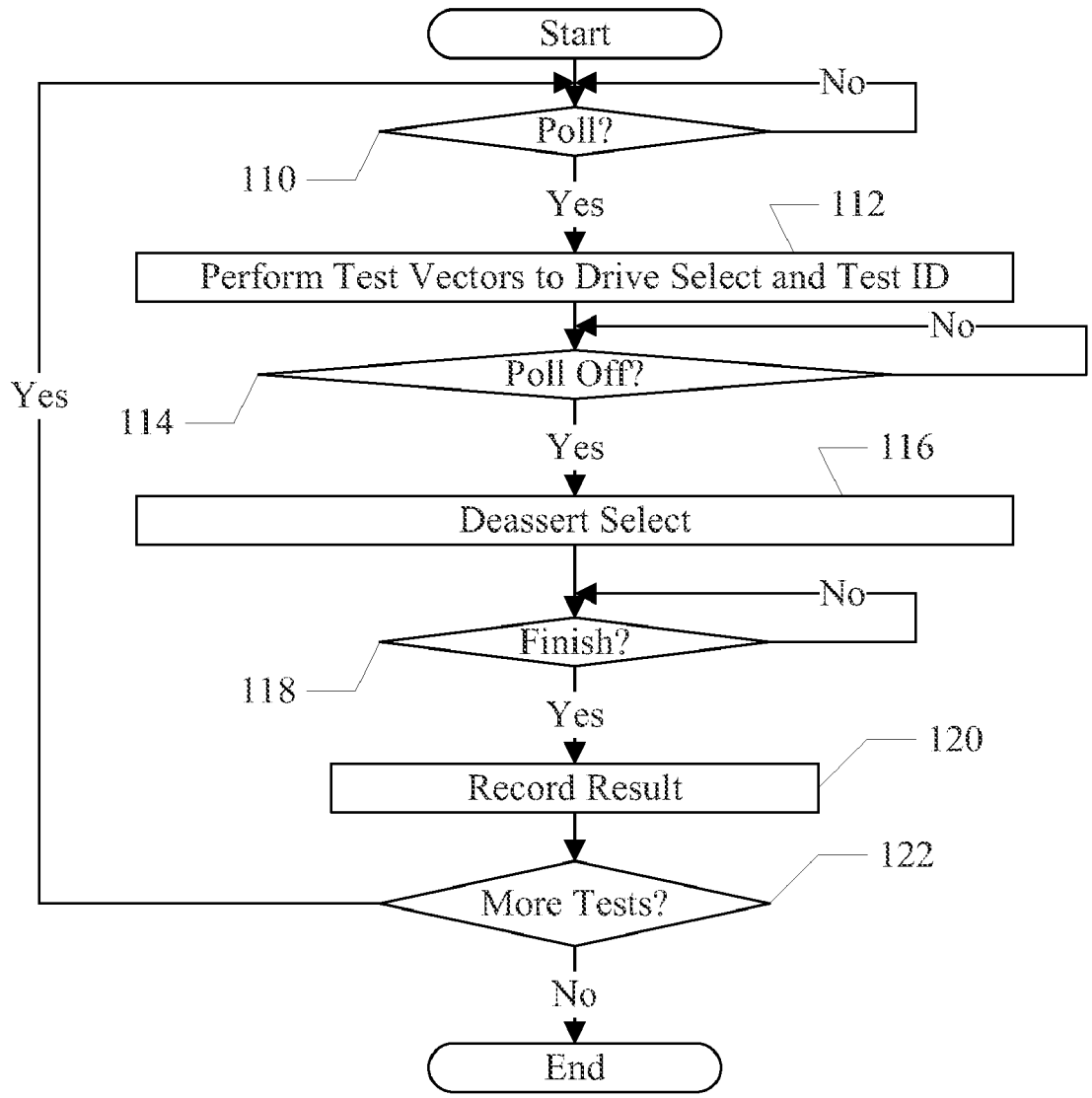
FIG. 9 is a flowchart illustrating one embodiment of the ATE communicating on the protocol during testing.

Turning now to FIG. 9, a flowchart is shown illustrating operation of one embodiment of the ATE 10 to communicate via the protocol with the control program 50. The flowchart of FIG. 9 may, for example, be the ATE portion of using the protocol to perform tests (block 42 in FIG. 2).

The ATE 10 may wait for the Poll signal to be asserted (decision block 110). In response to detecting the Poll signal (decision block 110, "yes" leg), the ATE 10 may perform one or more test vectors to assert the Test ID for the selected test and to drive the Select signal (block 112). A set of test vectors for each desired Test ID may be supplied, in an embodiment. The ATE 10 may wait for the Poll signal to deassert (decision block 114, "yes" leg), and may perform one or more test vectors that deassert the Select signal (block 116). The ATE 10 may wait for the Finish signal to assert (decision block 118, "yes" leg), and may execute a test pattern to detect the expected result (e.g. a Pass on the Result signal) and may record the result (block 120). If there are more tests to be run (decision block 122, "yes" leg), the ATE 10 may return to await the Poll signal assertion. Otherwise, the test is completed.

Figure 10:
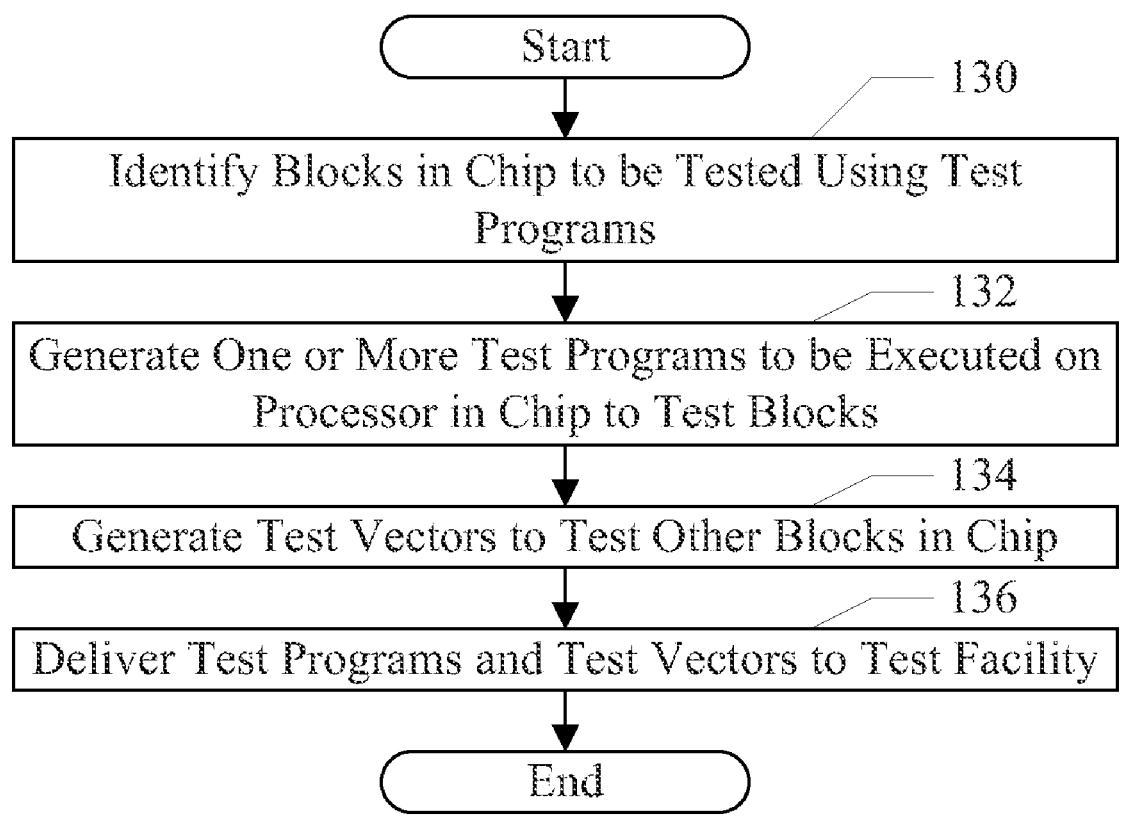
FIG. 10 is a flowchart illustrating one embodiment of a method for creating test programs for use in the test configuration of FIG. 1.

Turning next to FIG. 10, a flowchart is shown illustrating one embodiment of a method for creating tests for the DUT 14. The flowchart of FIG. 10 may be performed by the designers of the DUT 14, for example, to provide tests for the DUT 14 to the test facility.

Blocks within the chip which are to be tested using test programs may be identified (block 130). Suitable blocks may include, e.g., one or more of the following: blocks which have or would use asynchronous interfaces in the test, blocks which are not easily reachable using test vectors or would use a large number of test vectors for a relatively small test, blocks which may be more efficiently exercised from the processor in the DUT rather than test vectors, etc. One or more test programs may be generated (block 132). Each test program may include instructions to test the corresponding functionality, and may include instructions to check for a correct result and return to the control program 50. Traditional test vectors may be generated for other blocks in the DUT 14 (block 134), and the test programs and test vectors may be delivered to the test facility (block 136). The test programs and test vectors may be written to a computer accessible storage medium that may be physically transported to the test facility, or they may be electronically transmitted to the test facility (which may store them on a computer accessible storage medium). In either case, the ATE 10 may be configured to load the test vectors, test programs, etc. from the computer accessible storage medium. Test programs and/or the control program 50 may be supplied as software and/or as test vectors to write the software to the ROM 12.

Numerous variations and modifications will become apparent to those skilled in the art once the above disclosure is fully appreciated. It is intended that the following claims be interpreted to embrace all such variations and modifications.

What is claimed is:

1. A method comprising:
an automated test equipment (ATE) programming a memory with one or more tests to be executed by a device under test (DUT), wherein the DUT comprises at least one processor, and wherein the one or more tests comprise instructions to be executed by the processor, and wherein the memory comprises one or more discrete components separate from the DUT, and wherein the connections between the ATE, the DUL and at least a portion of the memory interface are through a first and second switch, wherein the ATE is coupled to the first and second switches, the memory interface is coupled to the second switch which is further coupled to the first switch and the DUT, and wherein the ATE programming the memory comprises:
the ATE connecting to at least the portion of a memory interface between the DUT and the memory via the first switch; the ATE disconnecting the DUT from the portion of the interface via the second switch;
the ATE performing write operations on the memory interface through the first switch to store the one or more tests in the memory subsequent to connecting the ATE and disconnecting the DUT;
the ATE disconnecting from the portion of the interface subsequent to performing the write operations, the ATE disconnecting through the first switch;
the ATE connecting the DUT to the portion of the interface responsive to the ATE disconnecting from the interface, the ATE connecting the DUT through the second switch;
the ATE booting the DUT subsequent to connecting the DUT to the portion of the interface;
the DUT reading the memory responsive to the booting; and
the processor in the DUT executing the one or more tests.

2. The method as recited in claim 1 further comprising:
the ATE programming the memory with a control program;
the DUT reading the control program from the memory responsive to the booting; and
the processor in the DUT executing the control program to manage execution of the one or more tests.

3. The method as recited in claim 2 further comprising, in response to executing the control program, the processor communicating with the ATE over one or more pins of the DUT.

4. The method as recited in claim 3 wherein the one or more pins are general purpose input/output (I/O) pins separate from the memory interface.

5. The method as recited in claim 3 further comprising the ATE performing a plurality of test vectors to communicate on the pins with the processor executing the control program.

6. The method as recited in claim 5 wherein the plurality of test vectors select, via communication on the one or more pins, which test of the one or more tests is to be executed.

7. The method as recited in claim 1 further comprising:
removing the DUT subsequent to testing the DUT;
connecting a second DUT in place of the DUT;
booting the second DUT from the memory without modifying a content of the memory programmed prior to booting the DUT, whereby the second DUT executes the same control program during testing as the DUT executed during testing; and
testing the second DUT under control of the control program and the ATE.

8. An apparatus comprising: an automated test equipment (ATE);
an integrated circuit coupled to the ATE, the integrated circuit comprising at least one processor; and
a memory having a memory interface, wherein the memory is discrete from the integrated circuit; and
first and second switch circuits, wherein the connections between the ATE, the integrated circuit, and at least a portion of the memory interface are through the first and second switch, wherein the ATE is coupled to the first and second switches, the memory interface is coupled to the second switch which is further coupled to the first switch and the integrated circuit, wherein the ATE is configured to control the first switch circuit to connect the ATE to at least a portion of the memory interface to program the memory with a control program to be executed by the processor on the integrated circuit and one or more tests to be performed on the integrated circuit, and wherein the ATE is configured to control the second switch circuit to disconnect the integrated circuit from the portion of the memory interface, and wherein the ATE is configured to program the memory subsequent to connecting the ATE and disconnecting the integrated circuit, and wherein the ATE is configured to control the first switch circuit to disconnect the ATE from the portion of the memory interface and to control the second switch circuit to connect the integrated circuit to the portion of the memory interface subsequent to programming the memory and prior to initiating testing of the integrated circuit, and wherein the ATE is configured to boot the integrated circuit subsequent to connecting the integrated circuit to the portion of the memory interface, and wherein the one or more switch circuits are discrete from the integrated circuit;
wherein the processor executing the control program communicates, during testing, with the ATE using a protocol implemented by the control program and test vectors on the ATE, wherein the protocol is communicated over a second interface that is separate from the memory interface.

9. The apparatus as recited in claim 8 wherein the second interface comprises one or more general purpose input/output (I/O) conductors included in the integrated circuit.

10. The apparatus as recited in claim 8 wherein the integrated circuit further comprises one or more peripherals coupled to the processor, wherein at least one of the tests is configured to test at least one of the peripherals.

11. The apparatus as recited in claim 8 wherein the one or more tests are programs to be executed on the at least one processor.

12. The apparatus as recited in claim 8 wherein the processor executing the control program communicates, during testing, with the ATE using a protocol implemented by the control program and test vectors on the ATE over a second interface that is separate from a first interface between the integrated circuit and the memory, and wherein the ATE is configured to communicate, during testing and via the protocol, an identifier identifying a selected test of the one or more tests to execute, and wherein the control program is configured to invoke the selected test responsive to receiving the identifier identifying the selected test, and wherein the protocol comprises the integrated circuit asserting a poll signal on a first pin of the second interface to request the identifier under control of the control program executing on the processor, and wherein the protocol comprises the ATE responding to the poll signal by asserting a select signal on a second pin of the second interface to return the identifier, and wherein the protocol further comprises the ATE providing the identifier on a plurality of additional pins of the second interface concurrent with asserting the select signal.

13. The apparatus as recited in claim 12 wherein the protocol includes the control program communicating a result of the test to the ATE.

* * * * *